United States Patent [19]

Kuroki et al.

[11] Patent Number: 4,545,684
[45] Date of Patent: Oct. 8, 1985

[54] ALIGNMENT MARK DETECTING APPARATUS AND METHOD

[75] Inventors: Yoichi Kuroki; Yukihiro Yoshinari, both of Kawasaki; Ryozo Hiraga, Yokohama, all of Japan

[73] Assignee: Canon Kabushiki Kaisha, Tokyo, Japan

[21] Appl. No.: 435,958

[22] Filed: Oct. 22, 1982

[30] Foreign Application Priority Data

Oct. 28, 1981 [JP] Japan .................. 56-172458

[51] Int. Cl.⁴ ............................. G01B 11/00
[52] U.S. Cl. .................... 356/400; 356/401
[58] Field of Search ........... 356/399, 400, 401; 250/548

[56] References Cited

U.S. PATENT DOCUMENTS

| | | | |
|---|---|---|---|
| 4,167,677 | 9/1979 | Suzki | 356/401 |
| 4,362,385 | 12/1982 | Lobach | 250/548 |
| 4,408,885 | 10/1983 | Johannsmeier et al. | 356/401 |

*Primary Examiner*—R. A. Rosenberger
*Attorney, Agent, or Firm*—Fitzpatrick, Cella, Harper & Scinto

[57] ABSTRACT

Alignment is effected between a mask having a plurality of first alignment marks, a wafer having a plurality of second alignment marks, alignment marks for another step juxtaposed with respect to the second alignment marks and a reference mark indicating the boundary between the second alignment marks and the alignment marks for another step. Alignment is effected by detecting device for detecting the first and second alignment marks and the reference mark and putting out a signal stream, and an electrical circuit for effecting the introduction of signals from the signal stream in accordance with a predetermined timing, extracting from the signal stream a signal regarding the reference mark and effecting the introduction of signals from the again detected signal stream at a timing changed in accordance with the signal regarding the reference mark.

11 Claims, 14 Drawing Figures

ALIGNMENT MARK DETECTING APPARATUS AND METHOD

BACKGROUND OF THE INVENTION

1. Field of the Invention

This invention relates to an apparatus for and a method of aligning a plurality of bodies.

2. Description of the Prior Art

In the manufacture of semiconductor integrated circuits, the steps of aligning a mask and a wafer and subsequently transferring the circuit pattern of the mask onto the wafer are repetitively effected. Alignment of the mask and the wafer is realized by registering alignment marks with each other. Since various patterns are transferred onto one wafer with masks interchanged sequentially, alignment marks for several steps are provided on the same wafer in advance.

To align the mask and the wafer, it is known to provide two or three alignment marks on the mask and wafer, respectively, scan these alignment marks by an emitted energy beam such as a laser beam, receive the energy scattered by the alignment marks and convert it into an electrical signal. The alignment marks and signal detecting apparatus of this type are described in U.S. Pat. No. 4,167,677, etc.

There is also known a system in which the images of alignment marks are picked up by a video image pickup tube or a photosensor array and the signals thereof are processed to obtain an alignment signal.

Figure 1:
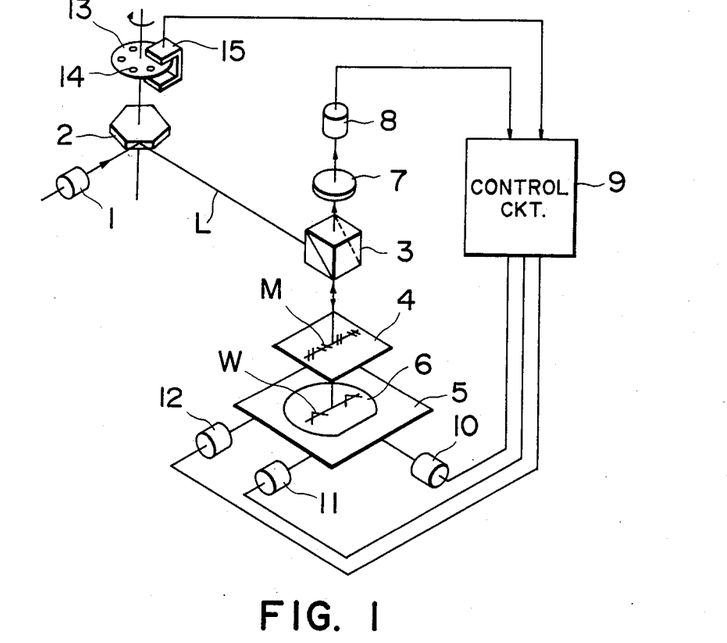
FIG. 1 shows the construction of the detecting apparatus according to the prior art.
Figure 2:
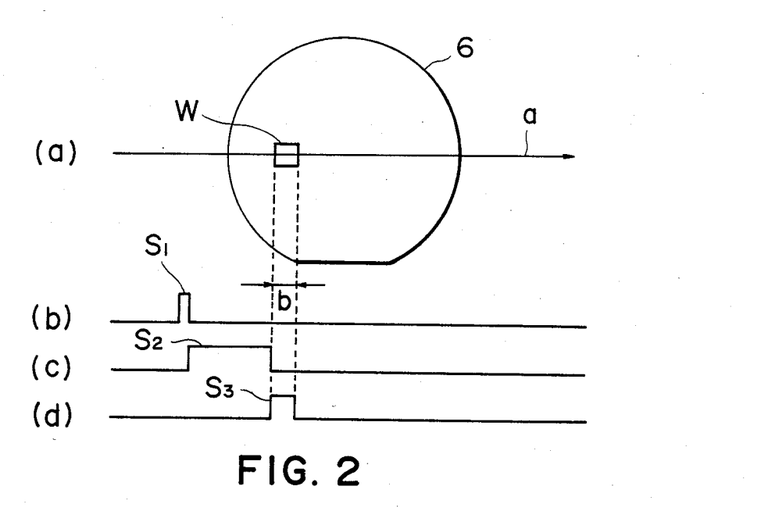
FIGS. 2 and 3 illustrate the read signals for a wafer.
Figure 3:
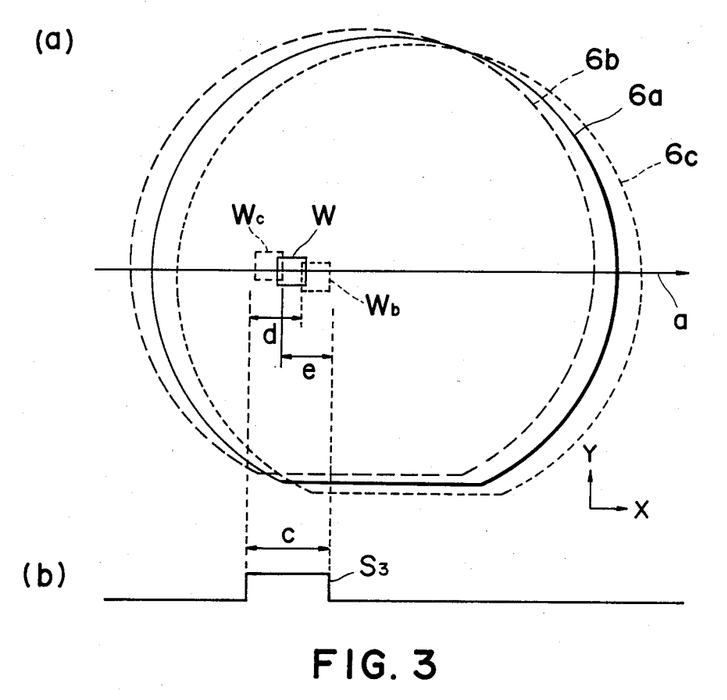

The prior art apparatus for aligning a mask and a wafer in the manufacture of semiconductors is constructed as shown, for example, in FIG. 1 of the accompanying drawings. The alignment marks M and W on a mask 4 and on a wafer 6 placed on a stage 5 are scanned by a laser beam L emitted from a laser light source 1, through a polygonal mirror 2 and a beam splitter 3, and the scattered light from the alignment marks M and W are detected by a photoelectric detector 8 through a condenser lens 7. The detected signals are supplied to a control circuit 9, which calculates the amount of displacement of the mask 4 and wafer 6 from these signals and moves the wafer 6 by drive motors 10, 11 for driving the stage 5 in X- and Y-directions and a drive motor 12 for driving the stage 5 in the direction of rotation, thereby accomplishing the aligning of the alignment marks M and W. Generally, however, the laser beam L scans also the portions on the wafer 6, for example, other than the alignment mark W in the direction of arrow a, as shown in FIG. 2 of the accompanying drawings, and therefore, a synchronizing signal for taking out the signal only on the alignment mark W, namely, a so-called window signal, is required. For this, for example, a small aperture 14 formed in a disc 13 rotatable about the same axis as the polygonal mirror 2 of FIG. 1 is detected by means of a photosensor 15, and, from the signal $S_1$ from this photosensor 15 shown at (b) in FIG. 2, a certain time signal, i.e., a prewindow signal $S_2$ shown at (c) in FIG. 2, is obtained and, further therefrom, a window signal $S_3$ corresponding to the time b during which the laser beam L scans the alignment mark W is provided. However, during the setting prior to the aligning, the wafer 6 is usually displaced as indicated by 6b or 6c in X- and Y-directions relative to the aligned position 6a, as shown at (a) in FIG. 3. Thus, the position of the alignment mark W is displaced as indicated by Wb or Wc relative to the scanning of the laser beam L in the direction of the X-axis. Therefore, the window signal $S_3$ must have a width c great enough to permit scanning of the alignment mark W even when the position of the wafer 6 has been displaced at maximum in the X-direction. Also, blank areas of widths d and e, respectively, are required on the left and right of the alignment mark W so that no other signal than the signal on the alignment mark W may be deleted within the duration of the window signal $S_3$ at this time.

Figure 4:
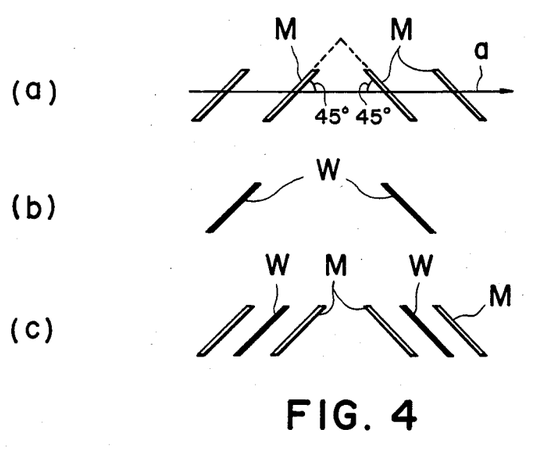
FIG. 4 illustrates alignment marks.
Figure 5:
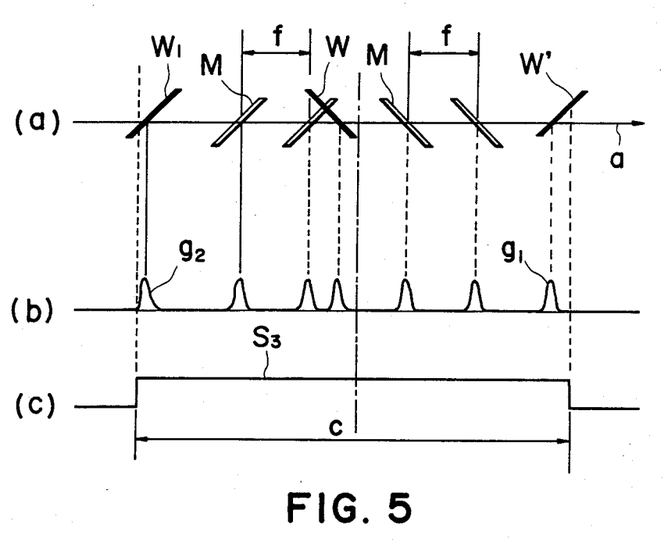
FIG. 5 illustrates the waveform obtained from the alignment marks.
Figure 6:
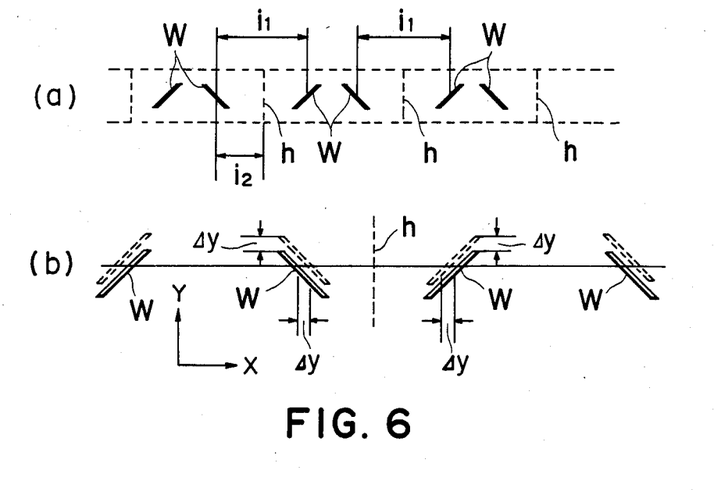
FIG. 6 illustrates a case where there are a plurality of marks.
Figure 7:
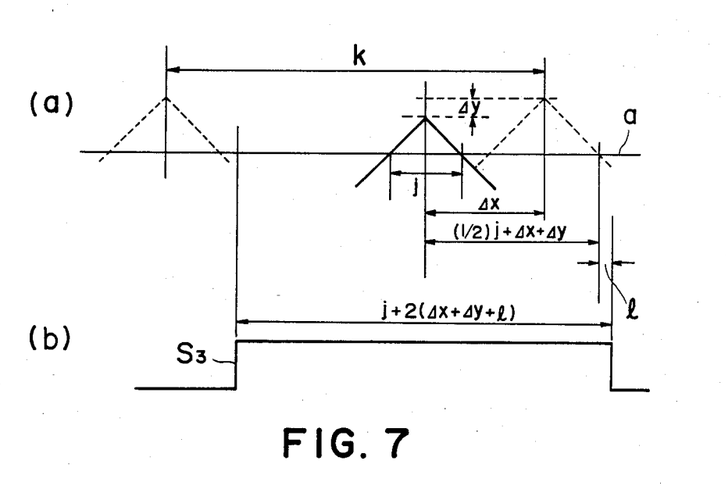
FIG. 7 illustrates the amount of displacement when the wafer is moved.

For example, where alignment marks M as shown at (a) in FIG. 4 of the accompanying drawings are placed on the mask 4 and alignment marks W as shown at (b) in FIG. 4 are placed on the wafer 6 and an attempt is made to align these into the aligned state as shown at (c) in FIG. 4, it is assumed that they are initially in the positional relation as shown at (a) in FIG. 5 of the accompanying drawings. At this time, by the scanning of the laser beam L, a pulse train as shown at (b) in FIG. 5 is obtained in the output of the detector 8. Characteristics are extracted from the spacings in this pulse train on the basis of the reference width f of the mark M on the mask 4, and the amount of displacement of the mask 4 and wafer 6 is found out. However, if a signal $g_1$ on the adjacent alignment mark W' of the wafer 6 for the next step exposure, for example, comes into the duration of the window signal $S_3$ such as shown at (c) in FIG. 5, the signal $g_1$ cannot be distinguished from the effective signal and aligning cannot be accomplished. On the other hand, the window signal $S_3$ need have a width c large enough to cover a signal $g_2$ of the most distant mark $W_1$ even where the wafer 6 when set has been displaced at maximum. Further, if any borderline h such as by a step exists between adjacent alignment marks where a plurality of sets of alignment marks W are juxtaposed in the direction of the scanning axis as shown at (a) in FIG. 6 of the accompanying drawings, the laser beam L is scattered at that position and enters the detector 8 intact. If this occurs within the duration of the window signal $S_3$, it cannot be discriminated from the signals of the marks W and aligning cannot be accomplished. Accordingly, sufficient blank areas need be provided on the left and right of each mark M so that the signal of the adjacent mark or the borderline h may occur within the duration of the window signal $S_3$ even if the spacing $i_1$ between the marks W is displaced at maximum during the setting where there is no borderline between the adjacent alignment marks W of the wafer 6 or even if the spacing $i_2$ between the end of the mark W and the borderline h is displaced at maximum during the setting where there is a borderline h between the adjacent alignment marks W of the wafer 6. In the case of alignment marks M and W having an inclination of 45° relative to the direction of the scanning axis a of the laser beam L as shown in FIG. 4 and when the wafer 6 is displaced by $\Delta_y$ in the Y-direction as shown at (b) in FIG. 6 of the accompanying drawings, it is also displaced by $\Delta_y$ in the X-direction which is the direction of the scanning axis. Thus, actually, it is also necessary to take into consideration, the maximum amount of displacement of the wafer 6 in Y-direction. Where, as shown in FIG. 7 of the accompanying drawings, the spacing on the scanning axis a between the alignment marks W of the wafer 6 in their aligned state is j and the maximum amount of displacement thereof in the X-direction is $\Delta_x$ and the maximum amount of displacement thereof in the Y-direction is $\Delta_y$, the width c of the window signal $S_3$ need be $j+2(\Delta_x+\Delta_y)$. If the distance between the marks W is k and the distance l is suitably determined, in a case where there is no borderline between the marks W of the wafer 6, the necessary condition is $$k \leq j + 2(\Delta_x + \Delta_y + l) \qquad (1)$$

and in a case where there is a borderline between the marks W of the wafer 6, the necessary condition is $$k > j + 2(2\Delta_x + \Delta_y + l) \qquad (2)$$

Thus, the size of the blank areas in the direction of the scanning axis of the alignment marks W of the wafer 6 greatly depends on the amount of displacement "$\Delta_x$ and $\Delta_y$" of the wafer 6 before aligned, and it is impossible to make the areas of the alignment marks W smaller than the dimensions prescribed by formulas (1) and (2) above.

SUMMARY OF THE INVENTION

It is an object of the present invention to detect a signal for highly accurately aligning a plurality of bodies.

It is another object of the present invention to permit a pattern for aligning to be made smaller.

It is still another object of the present invention to distinguish the aligning pattern of the current step from the aligning pattern of the previous step or the next step.

According to a specific embodiment of the present invention, which will hereinafter be described, in which the alignment marks of a mask and a wafer are to be detected to carry out aligning of the mask and wafer, the alignment mark now to be aligned and the boundary mark between this alignment mark and the alignment mark adjacent thereto are detected and thereafter the signal introducing timing is changed so that only the effective alignment mark is detected, whereby detection of the alignment marks is effected again.

DESCRIPTION OF THE PREFERRED EMBODIMENTS

Figure 8:
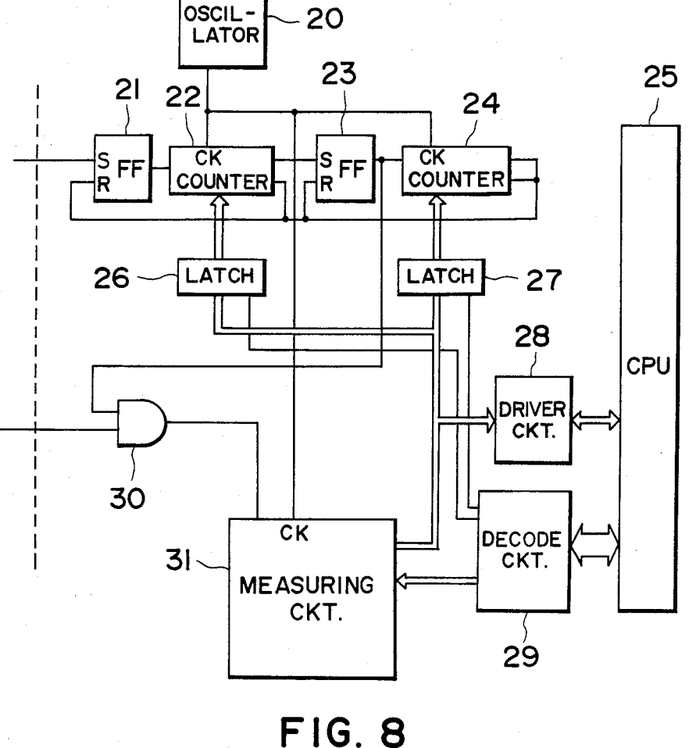
FIG. 8 shows the construction of an embodiment of the detecting circuit for realizing the method according to the present invention.
Figure 9:
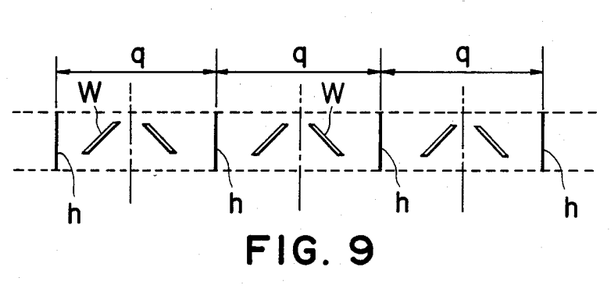
FIG. 9 illustrates a case where there are borderlines between the marks.

FIG. 8 shows an embodiment of the apparatus for carrying out the method according to the present invention. The apparatus of FIG. 8 comprises a clock oscillator 20, a flip-flop circuit (hereinafter referred to as the FF circuit) 21 set by the synchronizing signal from the polygonal mirror 2 (FIG. 1), a counter circuit 22 for counting the clocks of the clock oscillator 20 with the setting the FF circuit 21, an FF circuit 23 set by the set output of the counter circuit 22, a counter circuit 24 for counting the clocks of the clock oscillator 20 with the setting of the FF circuit 23, a latch 26 for presetting the data put out by CPU (central processing unit) 25 into the counter circuit 22 by the set output of the counter circuit 24, a latch 27 for presetting the data put out of the CPU 25 into the counter circuit 24 by the set output of the counter circuit 24, a driver circuit 28 for the data bus of the CPU 25, a decode circuit 29 for the address and control signal of the CPU 25, a gate 30 for logically multiplying the output of the detector 8 (FIG. 1) and the output of the FF circuit 23, and a measuring circuit 31 for counting the position of each pulse signal put out from the detector 8 as the distance from the synchronizing signal from the polygon mirror 2 and storing the same. FIG. 9 shows alignment marks W for the wafer 6 in which borderlines h are inserted between adjacent alignment marks W.

Figure 10:
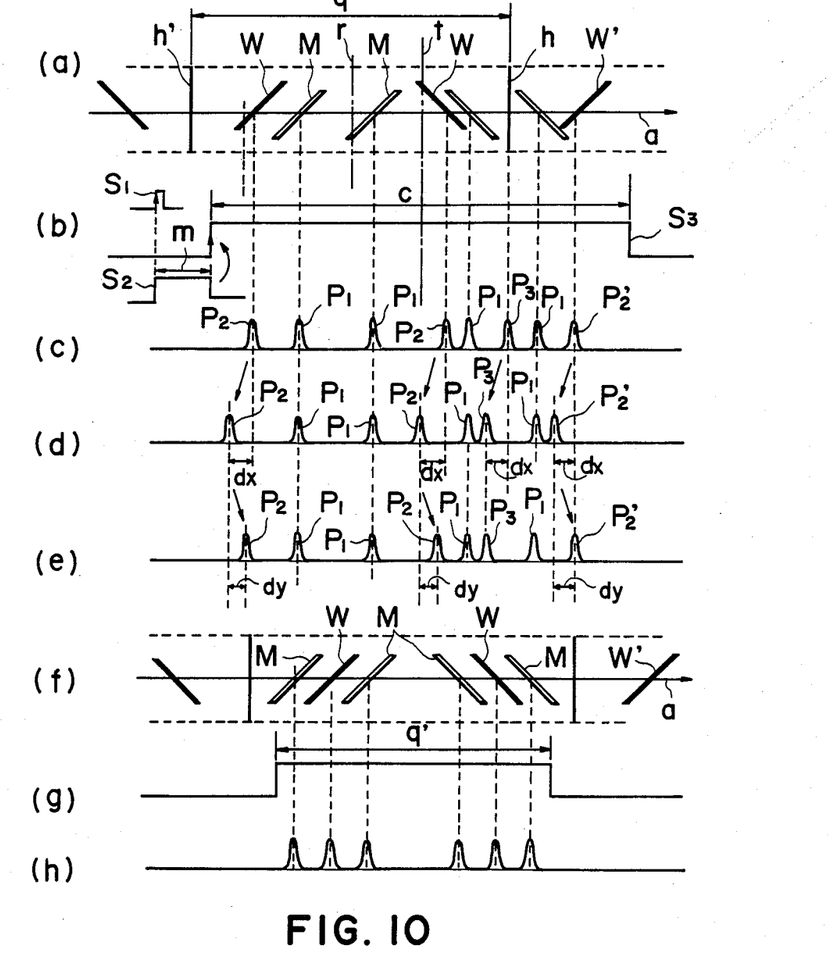
FIG. 10 shows the waveforms of the outputs of the marks when the wafer is moved relative to the mask.

In the above-described construction, it is assumed that during the setting of the wafer 6, the alignment marks W of the wafer 6 are displaced at maximum relative to the alignment marks M of the mask 4, as shown in FIG. 10(a). As a result, the borderline h between the marks W of the wafer 6 lies between the marks M of the mask 4. The CPU 25 first sets the width m of a prewindow signal $S_2$ and the width c of a window signal $S_3$ shown in FIG. 10(b) into the counter circuits 22 and 24 through the latches 26 and 27 so that they can introduce at least one of the signals of the borderlines h and h' even when the displacement of the wafer 6 is zero or even when the wafer 6 has been displaced at maximum. As a result, the duration m is counted by the counter circuit 22 and the duration c is counted by the counter circuit 24. The FF circuit 23 is set by the set output of the counter circuit 22 and is reset by the set output of the counter circuit 24 and therefore, the window signal $S_3$ is obtained from the output thereof. The output of the detector 8 shown in FIG. 10(c) during the duration c of the window signal $S_3$ passes through the gate 30 and is input to the measuring circuit 31, where the position of each pulse signal is measured, and the CPU 25 once reads this and stores it. Subsequently, the CPU 25 instructs movement of the wafer 6 by a minute amount $d_x$ in the X-direction which is the direction of the scanning axis. Thereupon, the signals $P_1$ from the marks M of the mask 4 do not move but only the signals $P_2$, $P'_2$ and $P_3$ of the marks W including the borderline h of the wafer 6 move by $d_x$ in the same direction, as shown in FIG. 10(d). In this condition, the CPU 25 again reads each signal position in the measuring circuit 31, compares it with the previously measured value and stores the signals $P_2$ which have moved. Subsequently, the CPU 25 instructs movement of the wafer 6 by a minute amount $d_y$ in the Y-direction. Thereupon, the signals $P_2$ and $P'_2$ from the marks W of the wafer 6, except the signal $P_3$ from the borderline h, move as shown in FIG. 10(e), but the signal $P_3$ of the borderline h does not move. Accordingly, of the signals which have moved when the wafer 6 has been moved by $d_x$ in the X-direction, the signal which has not moved when the wafer has been moved by $d_y$ in Y-direction is determined as the borderline h of the marks W of the wafer 6, and the position of the center r of the marks W is calculated from the width q between the borderlines h and h′ shown in FIG. 10(a). The wafer 6 is driven in the X-direction to adjust this to the center t of the marks M of the mask 4, thereby aligning the wafer and mask as shown in FIG. 10(f). The driving at this time may be coarse, and the center t of the mask need not be an actually measured value but may be a preset value. Subsequently, the CPU 25 changes the set values of the latches 26 and 27 so that the window signal $S_3$ may have a width q′ shown in FIG. 10(g) which is narrower than the width q between the borderlines h and h′ of the marks W of the wafer 6. Thus, of the signals obtained from the detector 8, only the signals from the marks M and W for aligning the mask 4 and the wafer 6 which are shown in FIG. 10(h) are obtained. The CPU 25 again introduces these signals thereinto and carries out fine aligning as the effective signals, and the displacements in the Y-direction and the direction of rotation can also be aligned at this time.

Figure 11:
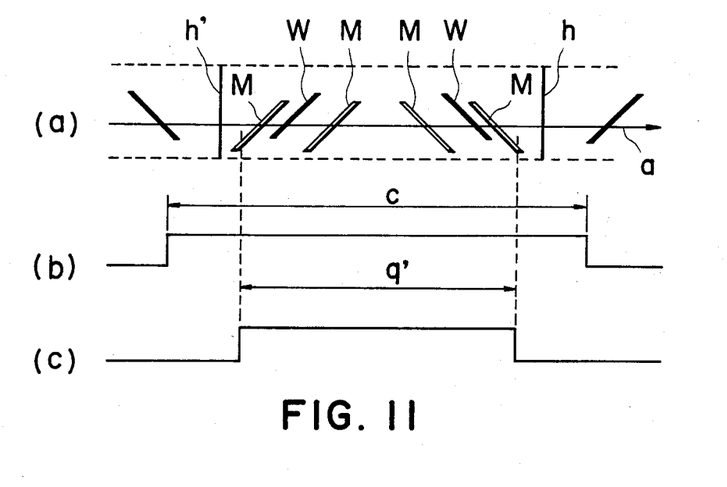
FIG. 11 illustrates a case where only the necessary mark signal is taken out.

When the borderlines h and h′ of the marks W of the wafer 6 do not lie inside the marks M of the mask 4 as shown in FIG. 11(a), the wafer is moved by a minute amount in the X- and Y-directions, respectively, until the borderlines h and h′ are found out, whereafter the duration c of the window signal $S_3$ is changed to q′ as shown in FIGS. 11(b) and (c), whereby fine aligning operation can be simply effected.

Figure 12:
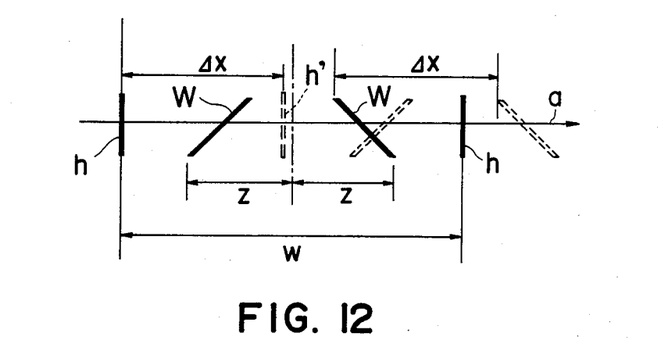
FIG. 12 illustrates the size of the marks.
Figure 13:
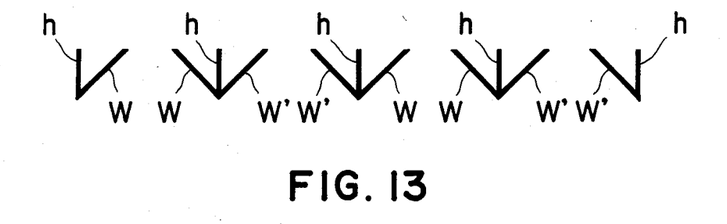
FIG. 13 illustrates another embodiment of the marks and borderlines.

The minimum dimension w of the width of the area of the alignment mark W according to the present invention which is shown in FIG. 12 depends only on $\Delta_x$ and may be $w > 2\Delta_x$ when the dimension z of the mark itself is smaller than the maximum amount of displacement $\Delta_x$ in the direction of the scanning axis ($z \leq x$), and when $z > \Delta_x$, adjacent alignment marks W and W′ may be disposed in contact with each other with the borderlines h interposed therebetween as shown in FIG. 13.

Figure 14:
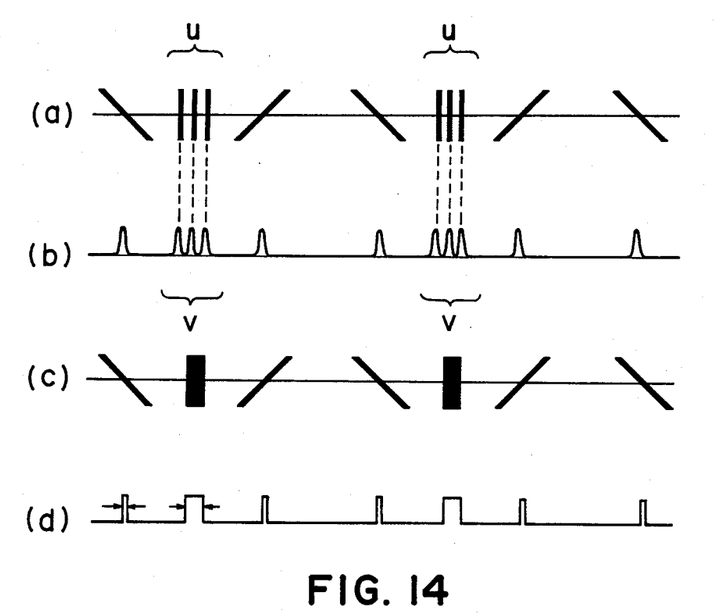
FIG. 14 illustrates still another embodiment of the borderlines.

In the above-described embodiment, lines perpendicular to the direction of scanning axis are provided as the borderlines h of the alignment marks W and the detection of the borderlines is accomplished by moving the wafer 6 by a minute amount in the X- and Y-directions, respectively, whereas the borderlines and the detecting method thereof are not restricted thereto, but for example, as shown in FIG. 14(a), several marks u may be provided as the borderlines and these borderlines can be discriminated as such by the frequency, etc. of the signal v from these marks u which is shown in FIG. 14(b). Also, as shown in FIG. 14(c), the width of the borderlines may be made different from the width of the alignment marks and the borderlines can be discriminated from the difference in pulse width shown in FIG. 14(d).

The method according to the present invention is widely applicable not only to the laser beam scanning but also to other detecting systems such as those using image pickup tubes.

What we claim is:

1. An alignment mark detecting apparatus, comprising:
   first supporting means for supporting a first body having at least one alignment mark thereon;
   second supporting means for supporting a second body having at least one first alignment mark thereon for use in a step of aligning the first body and the second body, at least one second alignment mark thereon for use in another alignment step and at least one reference mark for discriminating between the first and second alignment marks on the second body;
   detecting means for detecting the alignment mark on the first body, and the first and second alignment marks and the reference mark on the second body and for putting out a signal stream of signals representative of the marks;
   signal processing means for receiving signals comprising said signal stream in accordance with a changeable timing and detecting a signal representing each mark from the received signals;
   signal extracting means for extracting a signal representing the reference mark from the signal stream;
   timing changing means for changing the timing in response to the signal representing said reference mark extracted by said signal extracting means; and
   moving means for moving the first and the second supporting means relative to each other in response to the received and detected signals by said signal processing means in accordance with timing changed by said timing changing means to move the first body and the second body toward alignment.

2. An apparatus according to claim 1, wherein said timing changing means shortens the time within which signals are received by said signal processing means.

3. An apparatus according to claim 2, wherein said signal extracting means drives said moving means, and thereafter extracts the signal regarding said reference mark.

4. An apparatus according to claim 1, wherein said detecting means scans the marks in a scanning direction, and said signal extracting means drives said moving means to move said first and second bodies relative to each other in said scanning direction and a direction perpendicular to said scanning direction.

5. An apparatus according to claim 4, wherein said signal extracting means distinguishes said reference mark from the other marks for extraction therefrom by recognizing that the signal position thereof is not moved when said second body is moved in the direction perpendicular to said scanning direction.

6. An appparatus according to claim 1, wherein the reference mark is structurally different from the other marks whereby signals representative thereof put out by said detecting means have a different frequency characteristic from that of signals representative of the other marks, and wherein said signal extracting means distinguishes the reference mark from the other marks for extraction therefrom by recognizing the difference in frequency characteristic of the signals representing the reference mark from the frequency characteristics of the signals representing the other marks.

7. An apparatus according to claim 1, wherein the reference mark is structurally different from the other mark whereby signals representative thereof put out by said detecting means have a different pulse width from that of signals representative of the other marks, and wherein said signal extracting means distinguishes the reference mark from the other marks for extraction therefrom by recognizing the difference in pulse width of the signals representing the reference mark from the pulse width of the signals representing the other marks.

8. An alignment mark detecting method, comprising the steps of:
   providing at least one alignment mark on a first body;
   providing at least one first alignment mark and at least one second alignment mark on a second body and providing a reference mark on the second body having a shape different from the shapes of the first alignment mark and the second alignment marks, the reference mark indicating a boundary between the first alignment mark and the second alignment mark;

detecting the alignment mark on the first body, and the first alignment mark, the second alignment mark, and the reference mark on the second body, and putting out a primary signal stream of signals representative of the marks;

extracting from the primary signal stream a signal representing the reference mark;

introducing detection signals representing the alignment mark on the first body and the first alignment mark and the second alignment mark on the second body on the basis of the signal representing the reference mark extracted in said extracting step; and aligning the first body and the second body in accordance with said detection signals.

9. A method according to claim 8, wherein the first body and the second body are moved relative to each other and, wherein the reference mark is distinguished from the other marks on the basis of its different shape indicated by the movement of the first body relative to the second body.

10. A method according to claim 8, wherein the different shape of the reference mark produces, in said detecting step, a signal having a different frequency characteristics from the frequency characteristics of the signals representing the other marks, and wherein the reference mark is distinguished in said extracting step from the other marks by the difference in frequency characteristic.

11. A method according to claim 8, wherein the different shape of the reference mark produces, in said detecting step, a signal having a different pulse width from the pulse width of the signals representing the other marks, and wherein the references is distinguished in said extracting step from the other marks by the difference in pulse width.

* * * * *

UNITED STATES PATENT AND TRADEMARK OFFICE
CERTIFICATE OF CORRECTION

PATENT NO. : 4,545,684

DATED : October 8, 1985

INVENTOR(S) : YOICHI KUROKI, ET AL.

It is certified that error appears in the above-identified patent and that said Letters Patent is hereby corrected as shown below:

Column 2, line 7, change "deleted" to --detected--.

Column 3, line 5, change "k $\leqq$ " to --k $\geqq$ --.

Column 4, line 10, before "CPU" insert --a--; and
line 21, change "polygon" to --polygonal--.

Signed and Sealed this

Fifth Day of August 1986

[SEAL]

Attest:

DONALD J. QUIGG

Attesting Officer

Commissioner of Patents and Trademarks